Nov. 15, 1960 R. W. BRATSCHI 2,960,661
AUTOMATIC GAIN CONTROL CIRCUIT
Filed Jan. 16, 1957

INVENTOR
RAYMOND W. BRATSCHI

BY Cushman, Darby & Cushman
ATTORNEY

United States Patent Office 2,960,661
Patented Nov. 15, 1960

2,960,661

AUTOMATIC GAIN CONTROL CIRCUIT

Raymond W. Bratschi, St. Paul, Minn., assignor to Sperry Rand Corporation, New York, N.Y., a corporation of Delaware Filed Jan. 16, 1957, Ser. No. 634,447

11 Claims. (Cl. 330—127)

This invention relates to automatic gain control circuits.

There are a number of circuits which automatically control the gain of an amplifier to maintain the output at approximately a constant average amplitude level despite variations in input signal level. The simplest of these circuits consists of a rectified sample of the output signal applied as a degenerative feedback bias to one or more of the amplifier stages. Improved performance of automatic gain control (AGC) circuits can be obtained by insertion of a voltage delay, an amplification of the AGC signal, or a combination of both. In these systems large variations in input signal level are not completely compensated resulting in variations of the output signal level.

Briefly, this invention encompasses employing a second AGC loop wherein there is derived from the AGC input signal a secondary bias for an amplifying stage in the AGC circuitry itself (rather than in the main amplification channel), whereby the amplification factor of the stage varies in accordance with its input signal so as to keep the output signal level of the apparatus embodying the invention constant even when large variations in its input signal level occur.

Therefore, it is the primary object of this invention to provide an automatic gain control circuit which compensates for larger variations of input signal levels than heretofore possible.

It is another object of this invention to provide an automatic gain control circuit with improved AGC action, i.e., minimum variation in output level.

Another object of this invention is the provision in an automatic gain control circuit of a secondary loop for providing an AGC amplifier bias derived from its input signal to vary the amplification in the circuit automatically to provide constant volume.

Another object of this invention is the provision of an automatic gain control circuit including an amplifier for amplifying a signal derived from the input signal to be controlled in a nonlinear manner.

Another object in conjunction with the preceding objects is the provision of means for deriving a bias from said input signal for varying the amplification of said amplifier.

Another object of this invention is the provision of means for providing for said amplifier a relatively constant bias upon which said derived bias is effectively imposed.

Still other objects of this invention will become apparent to those of ordinary skill in the art by reference to the following detailed description of the exemplary embodiments of the apparatus and the appended claims. The various features of the exemplary embodiments according to the invention may be best understood with reference to the accompanying drawings, wherein:

The automatic gain control (AGC) system provided by this invention is suitable for use in any amplification system such as that employed in communication receivers of all types. The AGC system may be used to provide a constant average carrier voltage at the detector or in any other stage of a receiving system, and in this sense may be considered an automatic volume control system. As previously mentioned, there are numerous AGC or AVC systems presently employed. Some such systems may be seen on page 641 of "Radio Engineer's Handbook" by F. E. Terman (McGraw-Hill, New York, first edition, 1943). Some of these conventional systems merely derive from the diode detector a D.C. voltage free of modulation and proportional to the amplitude of the carrier, which voltage is fed back to the grids of the radio frequency, intermediate frequency, and/or converter tubes in a negative sense. Other systems add a delay voltage so that signals weaker than a predetermined strength are unaffected, but signals stronger than said predetermined strength are affected with a resulting tendency toward better constancy in the carrier voltage. Still other control systems utilize amplification stages with or without a delay voltage to cause the AGC signal to effect even greater constancy in the carrier voltage. However, even with amplification in the AGC feedback loop, extremely large variations in the input signal level of the carrier are not completely compensated for. By this invention, such large variations may be received without undesirable changes in the output signal level.

Figure 1:
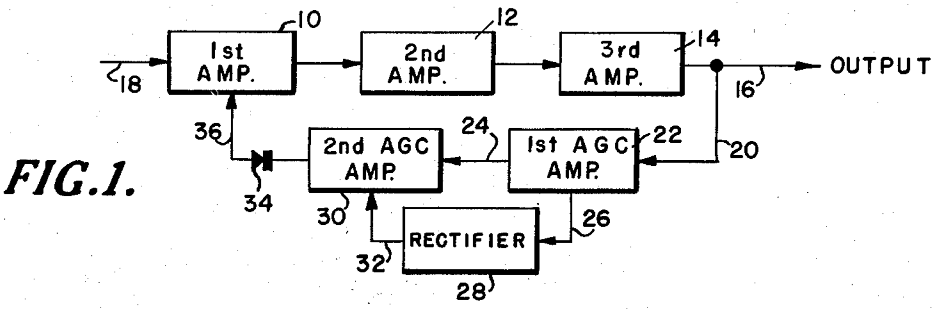
Figure 1 illustrates a block diagram of a circuit including an automatic gain control system having a secondary loop in conformance with this invention.

The invention is illustrated generally in Figure 1 in conjunction with three stages 10, 12 and 14 of an amplifying system. The output of the third amplifying stage 14 may be delivered over line 16 to a detector (not shown) or may be further provided to other amplifiers. In the practice of this invention, the input signal, normally including a carrier wave with or without modulation, on line 18 as amplified in said three stages is delivered to the AGC system over line 20. From such amplified input signal there is derived through a first AGC amplifier 22 a first signal on line 24 and a second signal on line 26. The first signal on line 24 is similar to the conventional undetected AGC signal. It is to be understood that amplifier 22 is not necessary to the operation of this invention from the standpoint of amplifying the input signal on line 20 to produce the signal on line 24, the main purposes of the circuit 22 being to act as a buffer and/or means from which said second signal on line 26 may be derived from the input signal on line 20. The second signal is suitably rectified in circuit 28 and delivered to a second AGC amplifier 30 over line 32. The second signal acts as a secondary bias which varies the gain of amplifier 30 as it amplifies said first signal from line 24. The output of amplifier 30 is then passed through a rectifier such as diode 34 oriented to provide on output AGC line 36, a negative bias which may be utilized in the conventional manner to vary the bias in at least one of the amplifying stages. It is to be understood that the AGC bias on line 36 may be applied not only to the first amplifying stage, but to any or all of the amplifying stages as well as the first detector in the receiving system as desired, no limitation in this matter being intended.

From Figure 1, it may be perceived that the AGC bias level on line 36 can be increased at a rate greater than the rate of the increase of the input signal as amplified and present on line 20, since the effect of the secondary bias on line 32 is to vary the gain of amplifier 30 in a manner such that the output on line 16 is held constant.

Figures 2, 3:
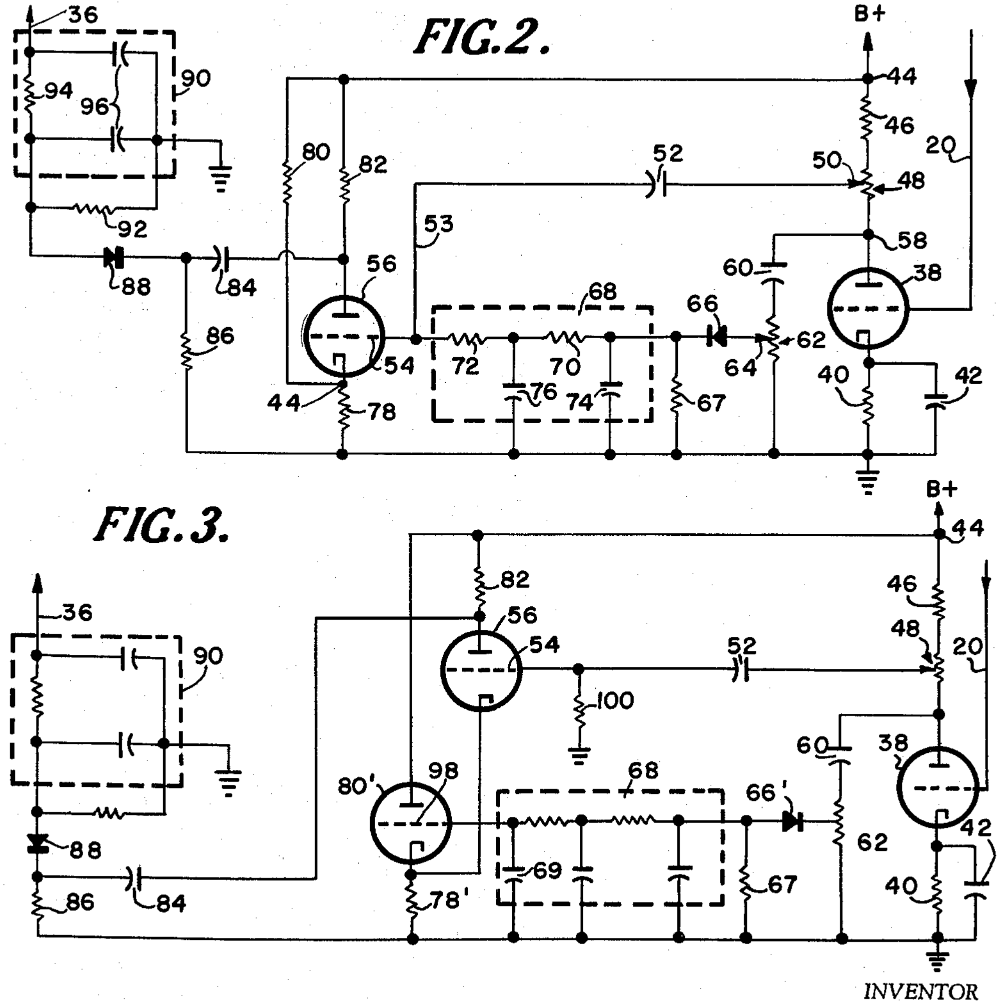
Figure 2 is a specific embodiment of this invention.
Figure 3 is another specific embodiment of this invention.

In Figure 2, there is illustrated a specific embodiment of the automatic gain control system of this invention. The signal on line 20 is presented to the control grid of tube 38 which is in the circuit designated 22 in Figure 1. Tube 38 as illustrated is a triode which is self-biased by a cathode resistor 40 by-passed to ground by condenser 42. The usual plate supply voltage is connected at junction 44 and applied to the plate of the tube through resistor 46 and potentiometer 48, both of which provide the necessary plate loading resistance. The signal resulting from the plate of tube 38 is tapped from potentiometer 48 by its arm 50 which is connected via condenser 52 and line 53 to the control grid 54 of a discharge device such as amplifying tube 56. The amplifying circuit 30 in Figure 1 may include an amplifier such as triode 56. The signal on grid 54 from potentiometer 48 is in form the same as the signal on line 20 but may be amplified by tube 38. As above mentioned, the amplification produced in tube 38 is not essential to the operation of this system, but such tube or any other similar means functions merely to divide the signal on line 20 into two signals, the first of which passes through condenser 52, and the second of which is a bias signal developed from the plate signal present at junction 58.

The plate signal at junction 58 is coupled by condenser 60 (which blocks direct current from the plate power supply) to potentiometer 62. A desired amount of the signal is selected by the potentiometer arm 64 and passed through rectification means such as a half wave rectifying diode 66 oriented to pass only the positive going portions of the signal. The output of diode 66 as present across resistor 67 is smoothed by filter 68 which may include, for example, series connected resistances 70 and 72 and parallel condensers 74 and 76 connected to ground potential. The output of filter 68 is consequently a quasi-static or direct current potential which varies in amplitude in accordance with the smoothed peak amplitude of the signal on line 20.

Although better performance may be obtained by use of filter 68, it is to be understood that a filter is not absolutely necessary to the practice of this invention, and that the rectification means, though shown simply as a single diode, may take any other desired form which will furnish a sufficiently steady D.C. bias and may be, for example, any full wave rectifier of known form.

The D.C. output from filter 68 is utilized to vary the effective bias on tube 56 by imposing the signal-derived bias onto grid 54. Tube 56 is normally provided in any suitable manner with another grid bias which is relatively fixed or constant. In the example illustrated, the fixed bias is provided by current through cathode resistor 78 which shares the supply potential connected at junction 44 with resistor 80 by means of a voltage dividing circuit. The total impedance of the voltage dividing resistors 78 and 80 is made comparatively much smaller than the total impedance of the plate-cathode circuit (including tube 56 and resistors 78, 82) of tube 56, so that current from the supply source at junction 44 contributed to resistor 78 from resistor 80 is much larger than that contributed from resistor 82 and tube 56. Therefore, the bias voltage produced across resistor 78 by current flowing therein is substantially constant and is relatively unaffected by changes in the average current through tube 56. Resistor 78 does produce cathode degeneration of the A.C. signal being amplified, and where this degenerative effect is undesired, it may be diminished by placing a by-pass capacitor across resistor 78 in the conventional manner.

As the output signal from filter 68 varies to change the effective bias on tube 56, the signal through condenser 52 is amplified in accordingly different amounts. That is, since the transfer characteristics of a triode vacuum tube are linear only over a small portion of their length, and the bias versus gain characteristic of the tube is not a constant for all operative values of bias signal, the variations of bias on grid 54 produce an output signal amplitude from tube 56 which varies nonlinearly with respect to the signal amplitude on line 20. In other words, if the input signal to line 20 increases in average amplitude, the effective bias on tube 56 reduces so that the amplification factor of the tube increases. Therefore, the signal through condenser 52 is amplified to a larger extent under such conditions. Incidentially, it is to be understood that resistor 67 provides a D.C. return for condenser 52 so that the signal impressed thereon from potentiometer 48 is present at grid 54.

The output signal from tube 56 is applied through blocking condenser 84 across resistor 86 and then rectified by diode 88 so as to present only a negative bias to output line 36 after being smoothed in filter 90. The input to filter 90 may be presented via resistor 92 and the filter itself may be of any type such as for example the resistance 94-capacitance 96 filter illustrated.

As is apparent from Figures 1 and 2, potentiometer 48 may be used to control the general level of the output signal on line 16, and in that sense it may provide for non-automatic volume control utilizable alone or in conjunction with the conventional volume regulators of the amplifying system. Alternatively, a fixed voltage divider may be utilized instead of potentiometer 48.

The secondary bias loop including diode 66 and filter 68 may be driven from either the plate or cathode circuit of tube 38. However, the preferred method is as illustrated in Figure 2 since thereby the largest driving variation for a given change in input signal level on line 20 is derived, and the amount of secondary bias desired can be conveniently controlled by potentiometer 62 or, alternatively, by a fixed voltage divider in its stead.

The secondary bias output from filter 68 may be applied to amplifier 56 in several ways. For example, if a pentode were substituted for triode 56, the secondary bias could be applied to the screen or suppressor grids thereof.

Figure 3 illustrates another way of varying the gain or amplification factor of tube 56 and that is by inserting the secondary bias voltage into the cathode circuit of tube 56 even though more power is thereby required than if the bias is applied directly to control grid 54. The impedance of resistor 80 of Figure 2 is replaced by an impedance such as a discharge device like triode vacuum tube 80′ whose cathode along with the cathode of the amplifying tube 56 is connected to ground through the common cathode resistor 78′. Since vacuum tube 80′ is a portion of a voltage dividing circuit, as above explained in relation to resistors 78 and 80, a variance of the impedance of tube 80′ by changing the grid bias thereto, changes the voltage across resistor 78′ so as to effectively vary the bias on amplifier 56. The bias of tube 80′ is varied by connection of its control grid 98 to the output of filter 68. In order to accomplish the same effect as the system illustrated in Figure 2, the output of filter 68 needs to be a negative bias. Therefore, rectifier 66′ is polarized so as to pass only the negative going portions of the signal derived from tube 38. That is, in order to increase the negative bias on output line 36, and consequently to increase the amplification of tube 56 as the input signal on line 20 increases, the effective negative bias on tube 56 must be decreased. This is accomplished by increasing the negative bias to grid 98 so as to reduce the voltage across resistor 78′, thereby effectively bringing the cathode bias of tube 56 toward zero volts. Since the signal which passes through condenser 52 has a ground return resistor 100 to provide for the relaxation of capacitor 52, resistor 67 need not be included in the circuit for that purpose; however, it is utilized as a D.C. return for diode 66′. Condenser 69 may be added in filter 68 if desired. The remainder of the circuit in Figure 3 operates in a manner similar to that explained for the corresponding parts of Figure 2.

As a modification, a variable mu tube such as a remote cutoff pentode may be used in place of the amplifying tube 56 so that the gain differences in the tube will be more noticeable with small changes in grid bias, as is well known in the art.

Although vacuum tubes have been illustrated and described relative to this invention, it is apparent that the invention extends not only to discharge devices of any type, but to passive elements such as magnetic devices or transistors which can accomplish similar functions.

If the input signal, such as might be present on line 18 of Figure 1, is less than that required to produce the desired output signal on line 16 under maximum gain conditions of all the amplifying stages (i.e., when the AGC bias on line 36 is zero), it may be desirable to include a delay voltage in the AGC circuit. This may be accomplished in any of several possible ways, such as for example, the methods suggested in the Terman handbook referred to above. Diode 34 in Figure 1 or diodes 88 in Figures 2 and 3 may be biased a predetermined amount so as to cause delay in allowing an AGC signal on line 36. Alternatively, either of tubes 28 or 56 may be biased an appropriate amount beyond cutoff to cause a desired delay.

Thus, it is apparent that there is provided by this invention systems in which the various phases, objects, and advantages herein set forth are successfully achieved.

Modifications of this invention not described herein will become apparent to those of ordinary skill in the art. Therefore, it is intended that the matter contained in the foregoing description and the accompanying drawings be interpreted as illustrative and not limitative, the scope of the invention being defined in the appended claims.

What is claimed is:

1. An automatic gain control circuit comprising a main amplification channel including at least a first amplifier whose gain is to be controlled, amplification means, means for applying a signal as it appears in said channel to said amplification means for amplification thereof, means for applying the output of said amplification means as a negative control bias to said first amplifier to cause the output of said channel to be relatively constant in amplitude, and means for increasing the constancy of the channel output regardless of amplitude variations, at least above a relatively low amplitude, in said signal as received by said channel comprising means for deriving from said signal as it appears in said channel a direct current bias having an amplitude varying directly as the amplitude of said signal, means applying said direct current bias to said amplification means for increasing the gain of the said amplification means when the amplitude of said direct current bias increases to make the channel output amplitude even more constant.

2. An automatic gain control circuit comprising a main amplification channel including at least a first amplifier whose gain is to be controlled, auxiliary amplification means, means for applying a signal as it appears in said channel following said amplifier to the said auxiliary amplification means for amplification thereof, means for feeding back the output of said auxiliary amplification means as a negative control bias to said first amplifier to compress the amplitude of the output of said channel, means for deriving from said signal as it appears in said channel following said amplifier a direct current bias having a magnitude varying directly as the amplitude of the said signal from which it is derived, means applying said bias to said auxiliary amplification means for increasing the gain of the said auxiliary amplification means when the magnitude of said direct current bias increases to compress the amplitude of the output of said channel even more whereby the constancy of the channel output amplitude is increased.

3. A circuit as in claim 2 wherein the said bias deriving means derives a positive direct current bias which varies in amplitude as aforesaid, and wherein said auxiliary amplification means had a control element to which the channel signal and said positive bias are both applied.

4. A circuit as in claim 3 wherein said auxiliary amplification means includes an output electrode and a reference electrode, and wherein the circuit further comprises means for providing to said reference electrode a substantially constant reference voltage which is substantially independent of the average current flowing between said output and reference electrodes or of variations in said positive bias as coupled to said control electrode or of the gain of the auxiliary amplification means.

5. A circuit as in claim 4 including a source of steady potential and a load resistor coupled between one side of said potential source and said output electrode, a second resistor coupled between the other side of said potential source and said reference electrode, and a third resistor coupled between said one side of the potential source and said reference electrode.

6. A circuit as in claim 2 wherein the said bias deriving means derives a negative direct current bias which varies in amplitude as aforesaid, and wherein said auxiliary amplification means has a control electrode to which the channel signal is applied and a reference electrode to which said negative direct current bias is coupled by said bias applying means.

7. A circuit as in claim 6 wherein said negative direct current bias applying means includes a follower device referenced to a constant potential with the output including said constant potential being coupled to said reference electrode.

8. An automatic gain control circuit comprising a main amplification channel including at least one amplifier whose gain is to be controlled, a buffer amplifier coupled to said channel following said one amplifier, an auxiliary amplifier, means coupling the output of said buffer amplifier to a control input of said auxiliary amplifier, a rectifier followed by a filter and coupled to the output of said buffer amplifier, means coupling the output of said filter as a variable bias to said auxiliary amplifier to increase the gain thereof with an increase in the magnitude of said bias, and means coupling the output of said auxiliary amplifier as a negative control bias back to at least the said one amplifier in said channel to cause a substantially constant channel output amplitude.

9. A circuit as in claim 8 wherein the said rectifier is oriented to pass positive signals from said buffer amplifier to said filter and the filter is connected to the said control input of the auxiliary amplifier.

10. A circuit as in claim 8 wherein the said rectifier is oriented to pass negative signals from said buffer amplifier to said filter and the filter is coupled to a reference electrode of said auxiliary amplifier.

11. A circuit as in claim 8 and further including means for providing for said auxiliary amplifier a reference voltage which is substantially independent of amplitude variations in the filter output, or gain variations in said auxiliary amplifier or the average current through the auxiliary amplifier.

References Cited in the file of this patent

UNITED STATES PATENTS

| | | |
|---|---|---|
| 2,006,052 | Kreuzer | June 25, 1935 |
| 2,164,939 | Pfister | July 4, 1939 |
| 2,201,022 | Bartels et al. | May 14, 1940 |
| 2,221,681 | Schlegel | Nov. 12, 1940 |
| 2,432,878 | Frederick | Dec. 16, 1947 |
| 2,462,452 | Yates | Feb. 22, 1949 |